US012676287B2

(12) United States Patent
Tanigaki

(10) Patent No.: US 12,676,287 B2
(45) Date of Patent: Jul. 7, 2026

(54) INFORMATION PROCESSING SYSTEM AND PHASE ANALYSIS SYSTEM

(71) Applicant: Hitachi, Ltd., Tokyo (JP)

(72) Inventor: Toshiaki Tanigaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 416 days.

(21) Appl. No.: 18/521,168

(22) Filed: Nov. 28, 2023

(65) Prior Publication Data

US 2024/0192152 A1    Jun. 13, 2024

(30) Foreign Application Priority Data

Dec. 8, 2022    (JP) ................................. 2022-196538

(51) Int. Cl.
*H01J 37/22* (2006.01)
*H01J 37/26* (2006.01)

(52) U.S. Cl.
CPC .......... *H01J 37/266* (2013.01); *H01J 37/268* (2013.01); *G01N 2223/045* (2013.01); *H01J 2237/2561* (2013.01); *H01J 2237/2594* (2013.01)

(58) Field of Classification Search
None
See application file for complete search history.

(56) References Cited

U.S. PATENT DOCUMENTS

| | | | |
|---|---|---|---|
| 9,312,098 B2 | 4/2016 | Lazic et al. | |
| 10,629,410 B2 * | 4/2020 | Tanigaki | ................. H01J 37/20 |
| 10,714,308 B2 | 7/2020 | Kohno | |
| 2009/0273789 A1 * | 11/2009 | Harada | ................. G01N 23/00 |
| | | | 356/450 |
| 2020/0124687 A1 * | 4/2020 | Shindo | .............. G01R 33/1284 |

OTHER PUBLICATIONS

Seki et al., Toward quantitative electromagnetic imaging by differential phase contrast STEM, Microscopy, 2021, 148-160 (Year: 2021).*

* cited by examiner

*Primary Examiner* — Eliza W Osenbaugh-Stewart
(74) *Attorney, Agent, or Firm* — Miles & Stockbridge P.C.

(57) ABSTRACT

An information processing system includes an input unit that receives a structure distribution of a sample and a first phase distribution of an electron beam, X-ray, light or neutron beam transmitted through the sample, a processing unit that computes a second phase distribution based on the structure distribution and computes an electromagnetic field component of the sample based on the first phase distribution and the second phase distribution, and an output unit that outputs the electromagnetic field component.

15 Claims, 16 Drawing Sheets

PHASE CHANGE DUE TO POTENTIAL DISTRIBUTION
INFORMATION TO BE OBTAINED

PHASE CHANGE DUE TO MEAN INNER POTENTIAL
STRUCTURE-DERIVED

*FIG. 4C*

12 ▬▬▬▬▬▬ 35
rad

TOTAL PHASE CHANGE

*FIG. 5*

SELECT DPC DATA

SELECT STRUCTURAL DATA

SELECT STRUCTURAL PHASE COMPUTATION PARAMETER DATA

COMPUTE STRUCTURAL PHASE DIFFERENTIAL

REMOVE STRUCTURAL PHASE DIFFERENTIAL FROM DPC DATA

DIFFERENTIAL OF PHASE CHANGE DUE TO STRUCTURE DISTRIBUTION    DISPLAY    SAVE

DIFFERENTIAL OF PHASE CHANGE DUE TO ELECTROMAGNETIC FIELD DISTRIBUTION    DISPLAY    SAVE

INFORMATION PROCESSING SYSTEM AND PHASE ANALYSIS SYSTEM

BACKGROUND OF THE INVENTION

1. Field of the Invention

The present invention relates to an information processing system and a phase analysis system.

2. Description of Related Art

An electron microscope is a device capable of performing observation and analysis of a structure of a substance at a level of atomic resolution, and is used in various fields, from research on physical properties to a biotechnology field. In particular, to perform atomic-level observation, a scanning transmission electron microscope or the like is used to obtain an image of a sample by accelerating an electron at an acceleration voltage of 100 kV or more, narrowing an electron beam with a short wavelength onto the sample, and detecting a transmitted electron while scanning the electron beam.

With the recent practical use of an aberration corrector, in an aberration corrected electron microscope, atomic resolution can be obtained even at an accelerating voltage of about 30 kV and the accelerating voltage of the microscope can be selected according to the purpose of observation. A differential phase contrast method (see U.S. Pat. Nos. 9,312,098B and 10,714,308B) is an observation method that has been attracting attention in recent years with the scanning transmission electron microscope.

In the differential phase contrast method, it is difficult to accurately measure a potential-derived phase change or a magnetic field-derived phase change intended to be measured in a measurement target whose structure-derived phase (structural phase) changes due to a change in a sample structure.

SUMMARY OF THE INVENTION

An object of the present invention is to accurately measure an electromagnetic field of the measurement target even when the structure of the sample changes, in an information processing system.

An information processing system according to an aspect of the present invention includes an input unit that receives a structure distribution of a sample and a first phase distribution of an electron beam, X-ray, light or neutron beam transmitted through the sample, a processing unit that computes a second phase distribution based on the structure distribution and computes an electromagnetic field component of the sample based on the first phase distribution and the second phase distribution, and an output unit that outputs the electromagnetic field component.

According to one aspect of the present invention, in the information processing system, it is possible to accurately measure the electromagnetic field of the measurement target even when the structure of the sample changes.

BRIEF DESCRIPTION OF THE DRAWINGS

FIG. 4C is a schematic diagram of a total phase change;

FIG. 5 is a schematic diagram of a phase profile of the phase change due to potential distribution, the phase change due to mean inner potential, and the total phase change;

FIG. 16A is a schematic diagram illustrating a phase analysis system combined with an electron microscope capable of changing measurement conditions according to Example 2;

FIG. 16B is a schematic diagram illustrating the phase analysis system combined with the electron microscope capable of changing measurement conditions according to Example 2;

FIG. 16C is a schematic diagram illustrating the phase analysis system combined with the electron microscope capable of changing measurement conditions according to Example 2;

DESCRIPTION OF EMBODIMENTS

Figure 1:
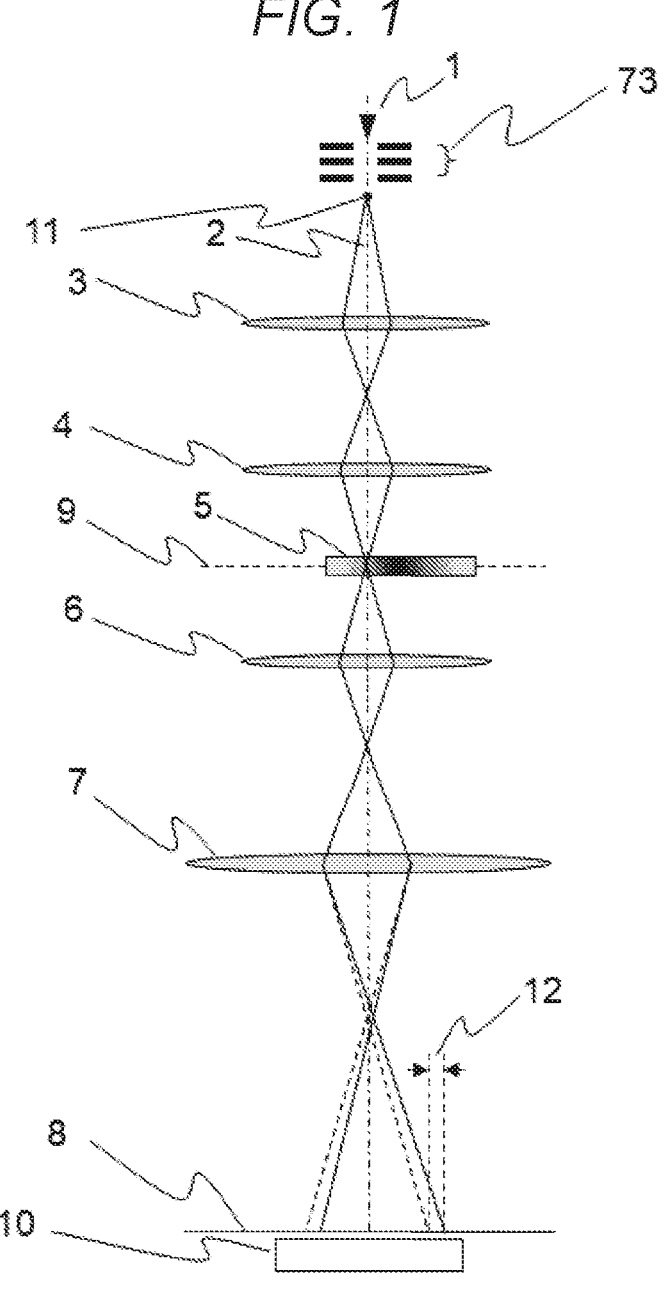
FIG. 1 is a schematic diagram of an example of a differential phase difference scanning transmission electron microscope device.

Hereinafter, examples of the present invention will be described with reference to the drawings. However, the present invention should not be construed as being limited to the contents of the examples described below. Those skilled in the art will easily understand that the specific configuration of the examples can be changed without departing from the idea or gist of the present invention.

In the configuration of the invention described below, the same reference numerals may be used in common for the same parts or parts having similar functions in different drawings, and redundant description thereof may be omitted.

First, an embodiment of the present invention will be described.

The present invention relates to a phase measurement technique for measuring an electromagnetic field, and more particularly to an electron microscope that irradiates a sample with a focused electron beam and scans the electron beam to obtain an image of the sample. The present invention also relates to a microscope device for performing observation of electromagnetic field information of the sample by detecting and analyzing a transmitted electron beam. Electromagnetic field measurement can be performed by phase measurement of synchrotron radiation and neutron beam as well as electron beam, so the present invention can be applied to electromagnetic field measurement methods by means of something other than electron beam.

FIG. 1 illustrates a schematic diagram of a differential phase contrast (DPC) scanning transmission electron microscopy.

An electron wave (electron beam) 2 emitted from an electron source 1 advances as illustrated. A convergence angle of the electron beam 2 is adjusted by an irradiation electron lens 3 and an objective lens 4, a sample 5 is placed between the objective lens 4 and an annular dark field (ADF) projection lens 6, and the sample 5 is irradiated with the converged electron beam 2.

Figure 2A:
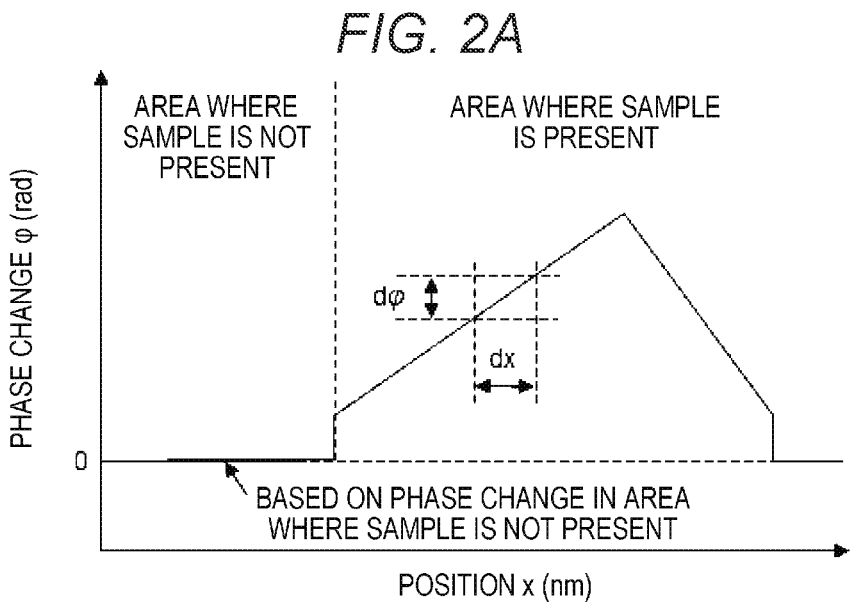
FIG. 2A is a schematic diagram illustrating a phase change of an electron beam due to a sample.

The electron beam 2 transmitted through the sample 5 is magnified by an effect of the ADF projection lens 6 and a magnifying lens 7, and the electron beam 2 is detected by a detector (camera) 10 on an observation surface 8. When an electromagnetic field is present in the sample 5, a phase change φ (rad) of the electron beam occurs at each position, as illustrated in FIG. 2A.

Figure 2B:
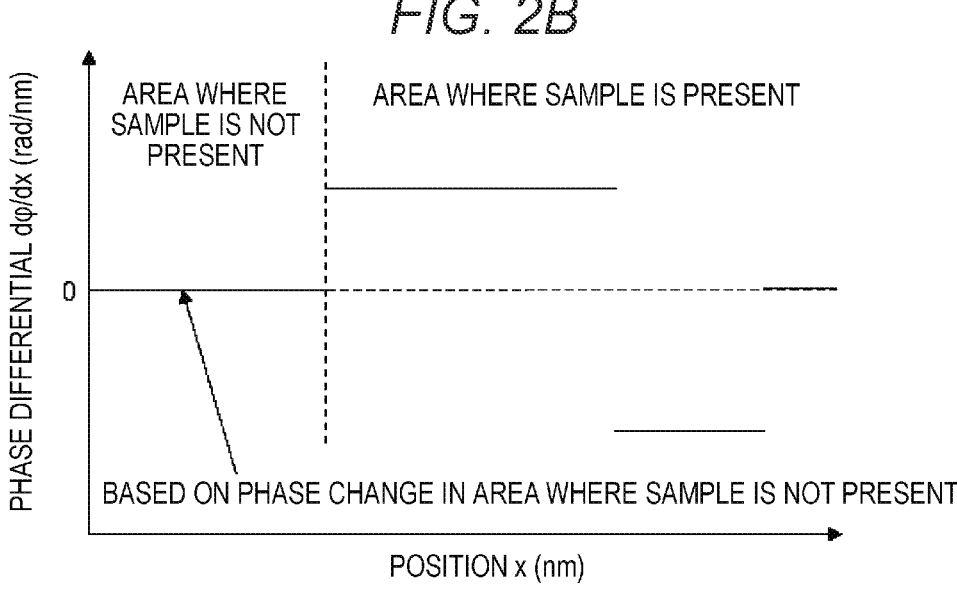
FIG. 2B is a schematic diagram illustrating a differential phase difference.

As a simple explanation, when considering a sample that has a phase change only in the x-direction of horizontal axis, a differential phase $d\varphi/dx$ (rad/nm) is illustrated with respect to the position x on the horizontal axis as illustrated in FIG. 2B. For example, when observing a sample of a magnetic thin film (thin film sample thickness of 50 nm) having saturation magnetization of 2T, a phase gradient of 0.152 rad/nm is generated. The phase gradient can be associated with a deflection angle θ of the electron beam influenced by the sample by the following Equation 1.

$$\theta = d\varphi \lambda / 2\pi / dx \qquad \text{(Equation 1)}$$

Here, λ is a wavelength of the electron beam.

When there is a differential phase difference due to the influence of the electromagnetic field by the sample 5, a position at which an electron is detected by the detector 10 changes, and a positional change 12 of the electron beam is detected.

Figure 3:
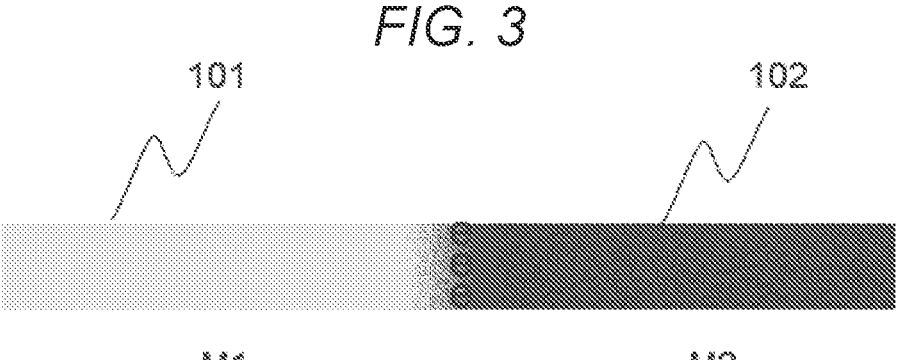
FIG. 3 is a schematic diagram of a sample.

FIG. 3 illustrates a model diagram of a sample structure and charge distribution assumed as a model of a measurement target.

The sample 5 is composed of a substance 101 and a substance 102, and is such a sample that electrons are accumulated between the two substances (interface). Here, factors by which the phase of the electron beam 2 changes as the electron beam 2 is transmitted through the sample 5 are divided into two. One is a phase change due to the influence of a potential distribution by electrons accumulated at the interface, and the other is a structure-derived phase change (structural phase) due to the influence of a mean inner potential (MIP) by which the phase of the electron wave changes as the electron wave is transmitted through the substance. Here, information intended to be obtained by a measurer is the potential distribution generated by charge accumulation at the interface.

Figure 4A:
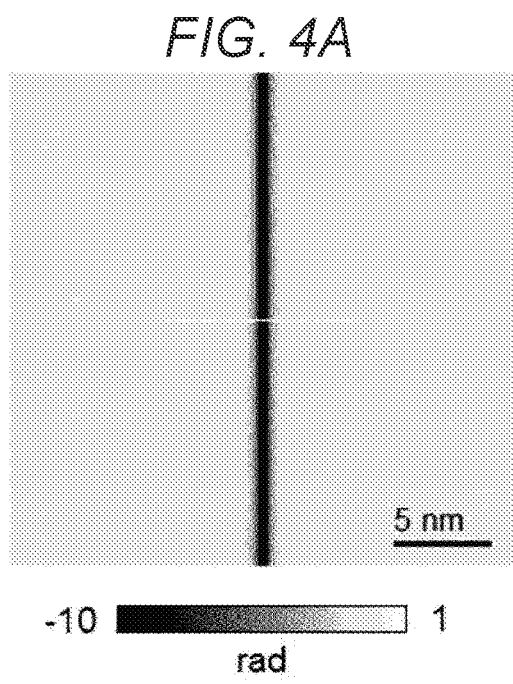
FIG. 4A is a schematic diagram of a phase change due to potential distribution.
Figure 4B:
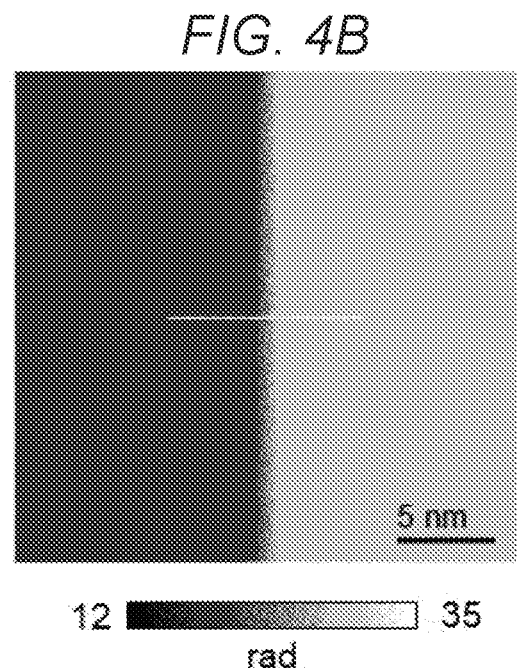
FIG. 4B is a schematic diagram of a phase change due to mean inner potential.
Figures 4C, 5:
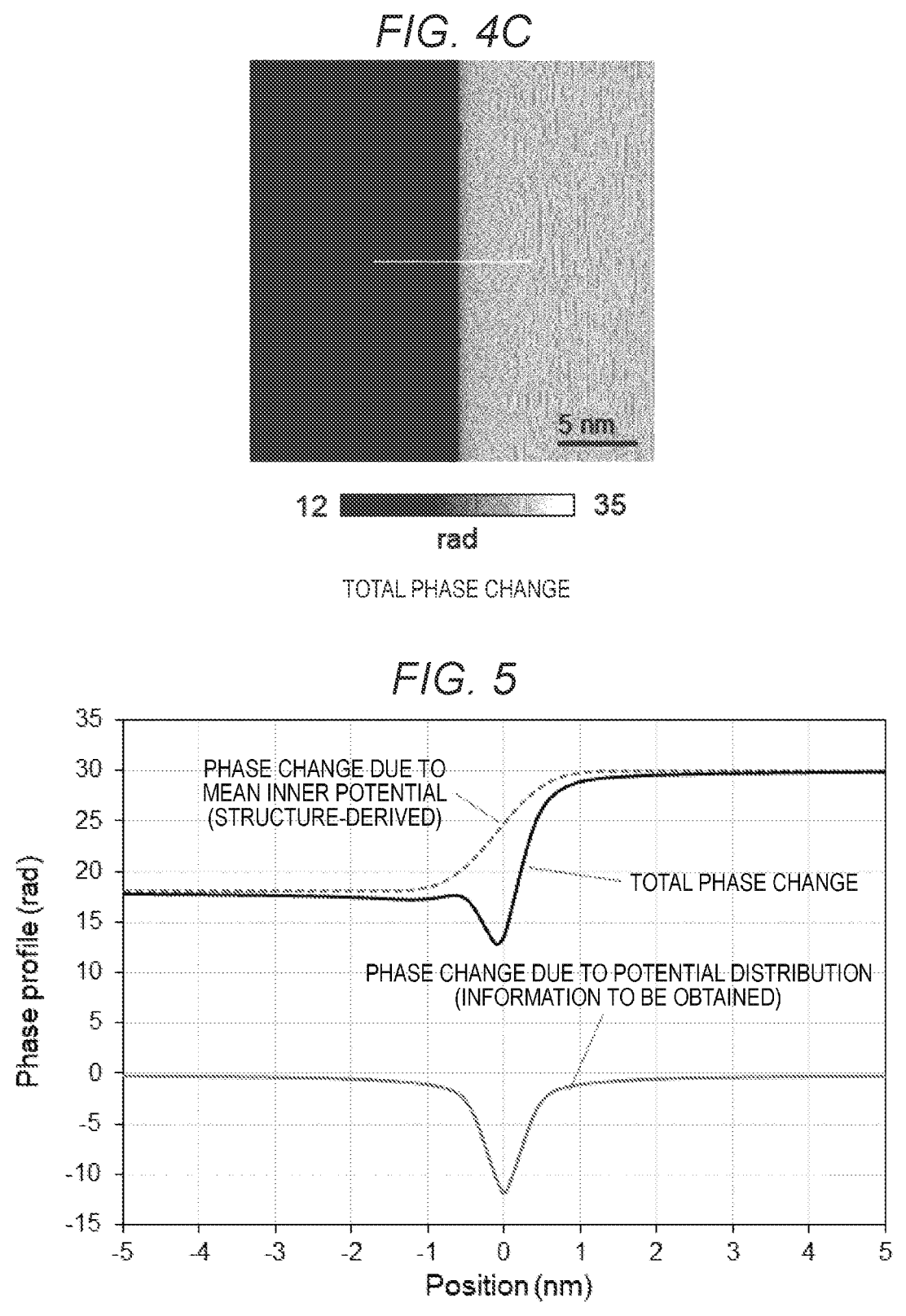

FIG. 4A illustrates the phase change due to the potential distribution generated by the electrons accumulated at the interface, FIG. 4B illustrates the phase change due to the mean inner potential, and FIG. 4C illustrates the total phase change given as the sum of the the phase changes.

FIG. 5 illustrates respective phase profiles for regions indicated by the white lines in FIGS. 4A to 4C of the interface region.

Figure 6:
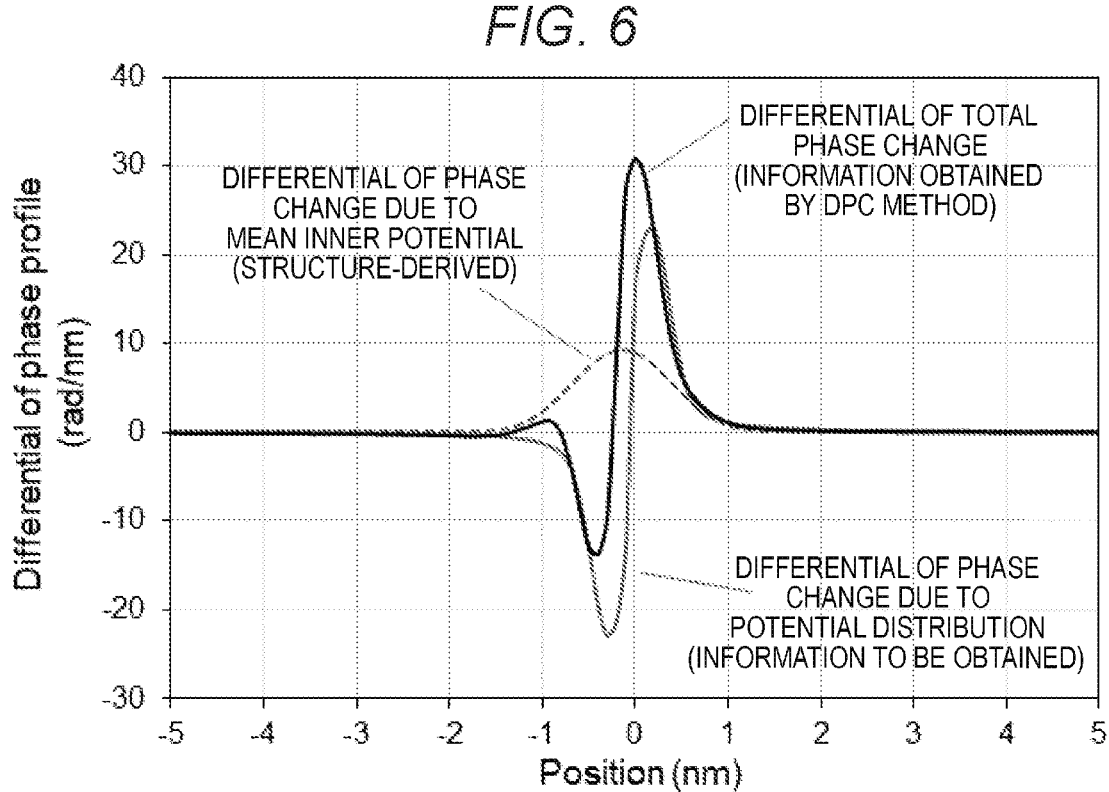
FIG. 6 is a schematic diagram of a phase differential profile of the phase change due to potential distribution, the phase change due to mean inner potential, and the total phase change.

The phase change due to the potential distribution intended to be measured is influenced by the structure-derived phase change that changes at the interface, and the total phase change changes. As a result, a profile of the differential value of phase obtained by a DPC method is as illustrated in FIG. 6.

For a differential of the phase change due to the potential distribution intended to be originally measured, a differential of the total phase change actually measured by the DPC changes under the influence of a differential of the structure-derived phase change due to the mean inner potential that differs depending on the substance.

Therefore, in the related-art method, when there is a change in the sample structure, the measurement target is influenced by the phase change due to the structural change, and the potential intended to be measured cannot be measured.

In FIG. 3, the model with a constant sample thickness is described, but even when the substance is the same, when the thickness of the sample changes, a structure-derived phase change increases in proportion to the thickness, and thus measurement of a potential that is originally intended to be measured is impeded. Therefore, the structural change in question here is a structural change which becomes a factor that causes a change in the structure-derived phase change such as a change in composition, thickness, or density of the sample.

In the above description, the influence of the phase change derived from the sample structure on the potential measurement was described, but the same problem also occurs in the magnetic field measurement. Since the structure-derived phase change is superimposed on the phase change due to the magnetic field and the measurement is made, when the structure-derived is present in an observation region, magnetic field information cannot be obtained from the measurement results as they are.

As described above, in the related-art method, it is difficult to accurately measure the potential-derived phase change and the magnetic field-derived phase change intended to be measured in the measurement target whose structure-derived phase (structural phase) changes due to the change in the sample structure.

Therefore, in the embodiment of the present invention, there is provided a microscopy method capable of accurately measuring an electromagnetic field of the measurement target even when the structure of the sample changes during electromagnetic field observation of the sample using a scanning transmission electron microscope.

Here, an example of an information processing system according to the embodiment of the present invention will be described with reference to FIG. 19.

Figure 19:
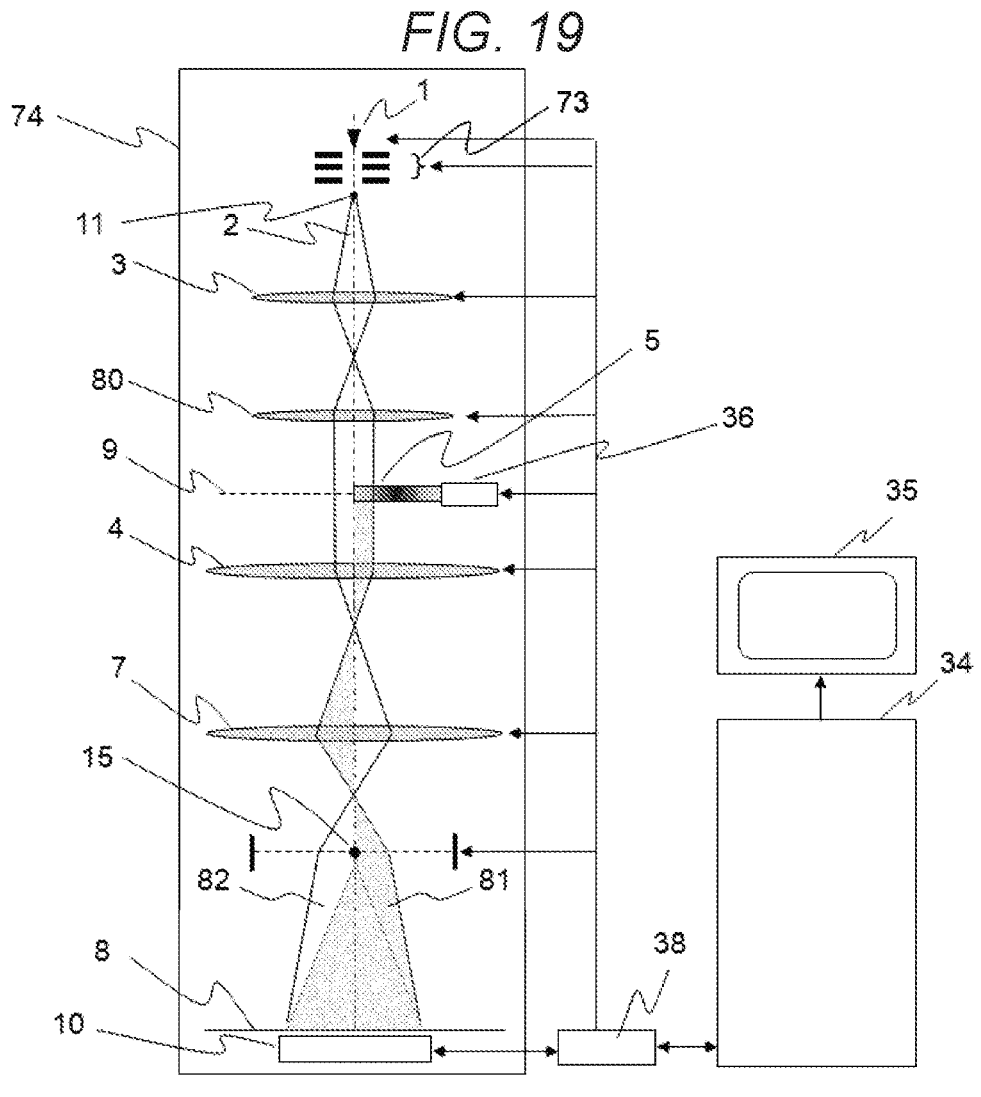
FIG. 19 is a schematic diagram illustrating an interference optical system when measuring a phase of the sample by electron holography according to an embodiment of the present invention.

FIG. 19 illustrates an interference optical system for measuring the phase of the sample by electron holography.

In the present embodiment, phase measurement of the electron beam illustrated in FIG. 19 and ADF measurement for analyzing the structure-derived phase are performed under different optical conditions. The phase measurement and the ADF measurement may be performed by separate devices.

The electron wave (electron beam) 2 emitted from the electron source 1 advances as illustrated. The current density is adjusted by a first irradiation electron lens 3 and a second irradiation electron lens 80, the sample 5 is placed on one side of an optical axis between the second irradiation electron lens 80 and the objective lens 4, and the sample 5 is irradiated with the electron beam.

An image obtained by the effect of the objective lens is magnified by the magnifying lens 7, and an electron wave 81 that passed through a first region (sample) on a sample surface 9 and an electron wave 82 that passed through a second region on the object surface are bent inward by an electron biprism 15 of an imaging system, is superimposed on and interferes the observation surface 8, and interference fringes (hereinafter also referred to as holograms) are detected.

Reproduction is performed from the obtained hologram, and a change in the electron wave due to the sample 5 is obtained. The electron wave 81 that passed through the first region, which reflects information of the sample 5, is an object wave 81, and the electron wave 82 that passed through the second region is a reference wave 82.

The electron biprism 15 has an electrode filament installed between parallel plates parallel to an electron wave traveling direction, and has a function of deflecting electron waves passing through left and right sides of the electrode filament to the inside or outside of the optical axis by an electric field between the filament electrode and the parallel plate generated by applying a potential to the electrode filament.

Electron beam measurement by the electron source 1 and the camera 10 is controlled by a control system 38 connected to a control personal computer (control PC) 34. The control PC 34 has a normal computer configuration including a central processing unit (CPU) as a processing unit, a memory as a storage unit, an input/output interface unit, and the like, which are interconnected. The control PC 34 is connected to a monitor 35.

As described above, in FIG. 5, the phase change due to the potential distribution intended to be originally measured is influenced by the structure-derived phase change that changes at the interface, and the total phase change changes.

Therefore, in the embodiment of the present invention, the phase change due to the potential distribution intended to be measured is obtained by performing a computation of subtracting the structure-derived phase change from the total phase change. The computation is performed by the control PC 34 configuring the information processing system illustrated in FIG. 19.

In FIG. 6, for the differential of the phase change due to the potential distribution intended to be originally measured, the differential of the total phase change actually measured by the DPC changes under the influence of the differential of the structure-derived phase change due to the mean inner potential that differs depending on the substance.

Therefore, in the embodiment of the present invention, a differential measurement of the phase change due to the potential distribution intended to be originally measured is obtained by performing a computation of removing the differential of the structure-derived phase change due to the mean inner potential that differs depending on the substance from the differential of the total phase change measured by the DPC. The computation is performed by the control PC 34 configuring the information processing system illustrated in FIG. 19.

As described above, the information processing system of the embodiment of the present invention includes an input unit that receives a structure distribution of the sample 5 and a first phase distribution (total phase change in FIG. 5) of the electron beam 2 transmitted through the sample 5, a processing unit that computes a second phase distribution (structure-derived phase change in FIG. 6) based on the structure distribution and computes an electromagnetic field component of the sample 5 (phase change due to potential distribution intended to be measured in FIG. 5) based on the first phase distribution and the second phase distribution, and an output unit that outputs the electromagnetic field component.

Here, the processing unit is composed of a central processing unit (CPU) of the control PC 34, and the input unit and the output unit are composed of an input/output interface unit of the control PC 34.

The information processing system of the embodiment of the present invention can be applied to the structure distribution of the sample and X-rays, light, or neutron beams other than the electron beam transmitted through the sample.

The processing unit computes a phase change due to the mean inner potential of the sample 5 derived from the structure distribution as the second phase distribution, and computes a third phase distribution, which is a phase change due to the potential distribution of the sample 5, as the electromagnetic field component. Then, the processing unit computes the third phase distribution by subtracting the second phase distribution from the first phase distribution.

The processing unit computes a first differential value of the first phase distribution (differential of total phase change actually measured by the DPC in FIG. 6) and a second differential value of the second phase distribution (differential of structure-derived phase change due to mean inner potential in FIG. 6), computes a third differential value of the third phase distribution (differential of phase change due to potential distribution to be originally measured in FIG. 6) based on the first differential value and the second differential value, and computes the electromagnetic field component of the sample based on the third differential value. Specifically, the third differential value is computed by performing a computation of removing the second differential value from the first differential value.

According to the embodiment of the present invention, in the information processing system, it is possible to accurately measure the electromagnetic field of the measurement target even when the structure of the sample changes.

Examples will be described below with reference to the drawings.

Example 1

Figure 7:
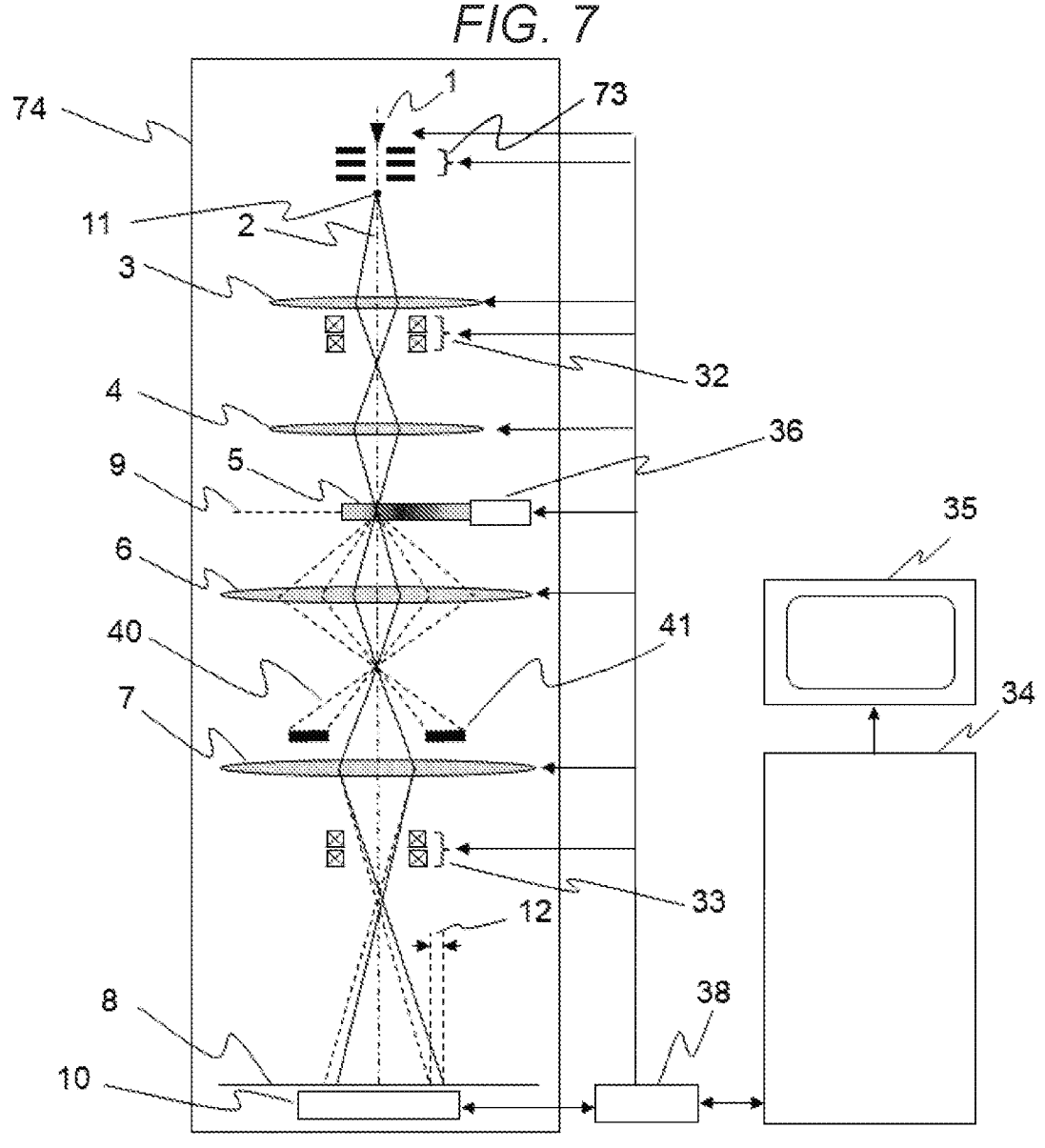
FIG. 7 is a schematic diagram illustrating a phase analysis system combined with an electron microscope according to Example 1.

Example 1 of the electron microscope of the present invention will be described with reference to FIG. 7. FIG. 7 is a diagram illustrating a configuration of Example 1 in which an electron microscope and a phase analysis system are combined in differential phase difference measurement using a scanning transmission electron microscope. A principle configuration described below can be similarly applied to electron microscopes and phase analysis systems of other examples.

In FIG. 7, the electron source 1 is positioned at the most upstream portion in a flow direction of the electron wave (electron beam) 2, a voltage is applied to a first extraction electrode, a second extraction electrode, and an acceleration electrode, and an electron wave emitted from the electron source 1 is accelerated and converged on a first electron source 11. In the present specification, the first extraction electrode, the second extraction electrode, and the acceleration electrode are collectively defined as an acceleration tube 73. By controlling the applied voltage, a wavelength of the electron beam 2 changes and a trajectory thereof also changes. Accordingly, the first electron source 11 on electronic optics is drawn again in the figure.

In the present configuration, although a diaphragm is not illustrated between the acceleration tube 73 and the sample 5 in FIG. 7, since the use of the diaphragm to adjust an electron wave irradiation region to the sample 5 is not different from a general microscope, illustration thereof is omitted here. Although only one irradiation electron lens 3 is illustrated, even when using two or more irradiation electron lenses to adjust the electron beam irradiation conditions for the sample 5, the configuration is not different from the general microscope, thus illustration thereof is omitted.

The electron beam is converged by the effect of the objective lens 4 and is irradiated onto the sample. Scanning of the electron beam 2 in an in-plane direction at the sample position is performed by a scanning coil 32. The electron beam that passed through the sample 5 is magnified or reduced by the effect of the ADF projection lens 6 and the magnifying lens 7, and the electron beam 2 is detected by the camera 10 installed on the observation surface 8. Differential phase contrast (DPC) information is obtained from the change 12 in the electron position. Meanwhile, scattered electrons 40 scattered by the sample 5 are magnified or reduced by the ADF projection lens 6 and detected by an annular detector 41.

Figure 8:
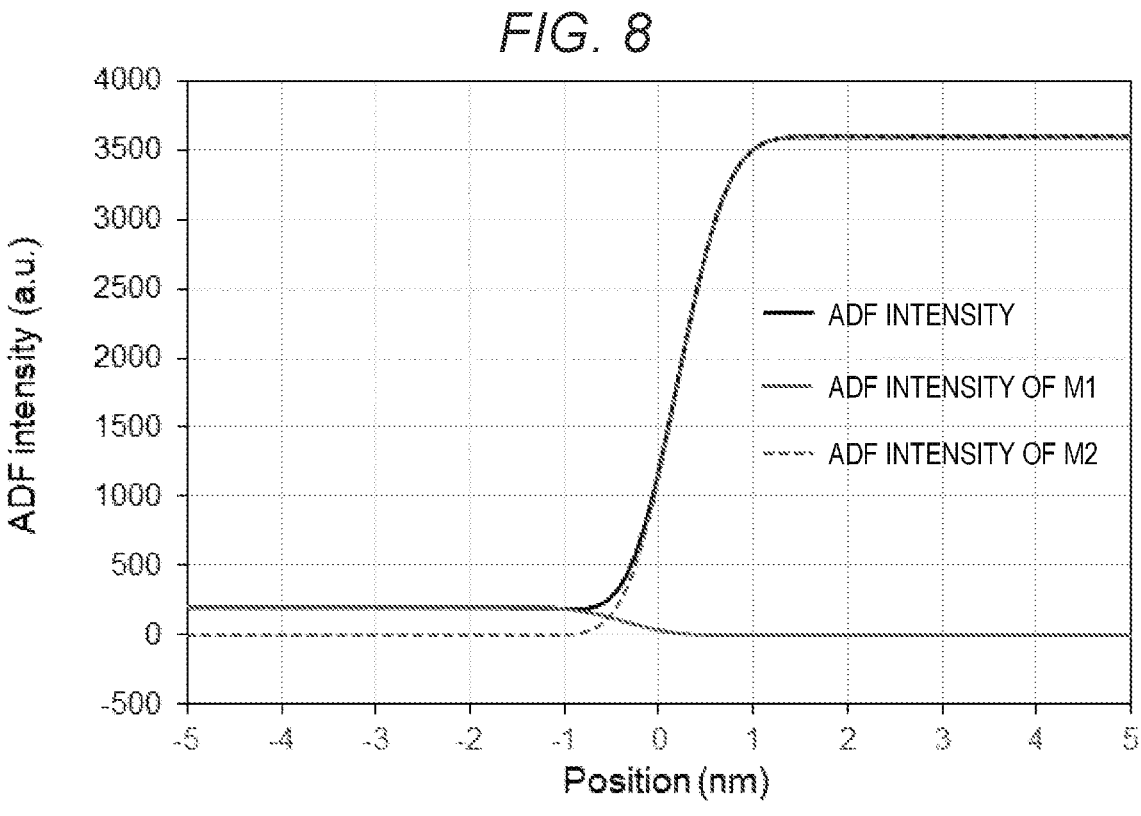
FIG. 8 is a schematic diagram of an intensity profile of an ADF image.

FIG. 8 illustrates a schematic diagram of an ADF intensity profile obtained in the case of the model sample illustrated in FIG. 3.

ADF intensity is given as the sum of the ADF intensity profiles for a substance M1 and a substance M2 respectively. Image intensity I of the ADF is given by Equation 2 below.

$$I \propto Z^2 \qquad \text{(Equation 2)}$$

Here, Z is the atomic number configuring the sample. Since the image intensity is proportional to the square of Z, the contrast of the ADF image is sometimes called 22 contrast or Z contrast. The image intensity may not be completely proportional to the square of Z depending on the sample and measurement conditions.

Figure 9:
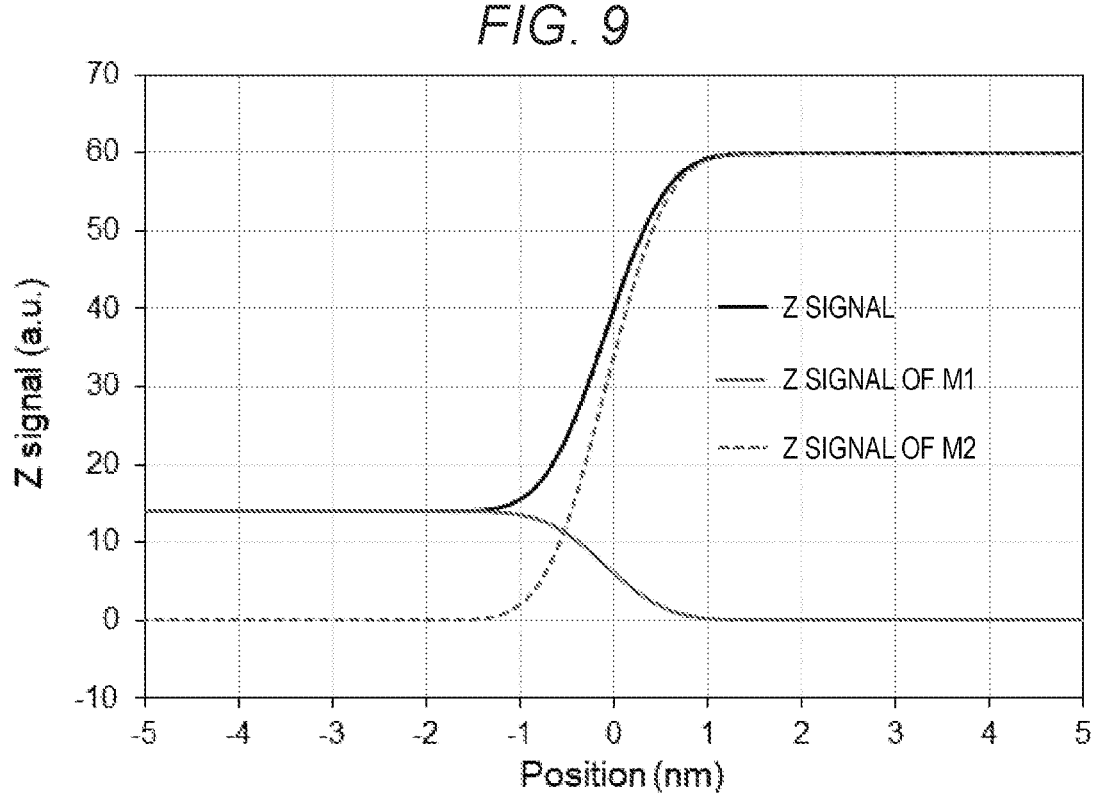
FIG. 9 is a schematic diagram illustrating a Z signal profile computed from ADF intensity.

Next, FIG. 9 illustrates the Z signal calculated from the ADF intensity using Equation 2. Z signals derived from M1 and M2 are obtained as a sum.

Figure 10:
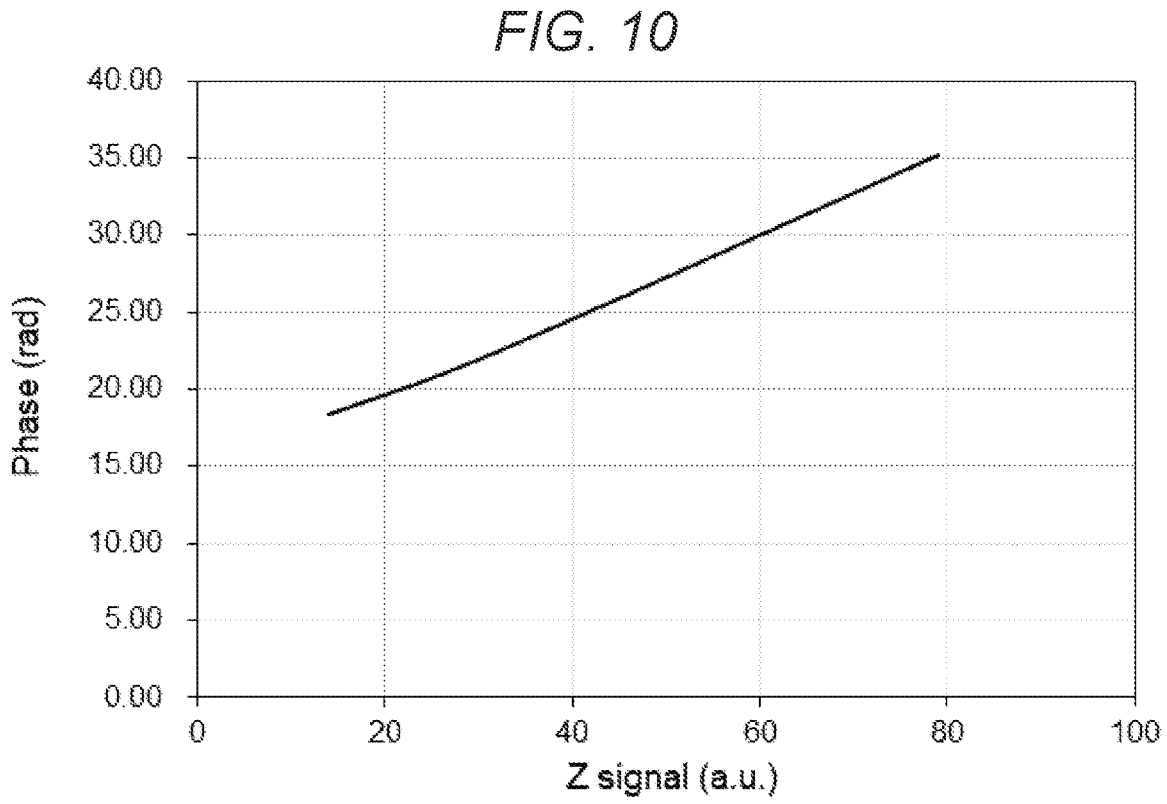
FIG. 10 is a schematic diagram illustrating a relationship between Z signal and phase change.
Figure 11:
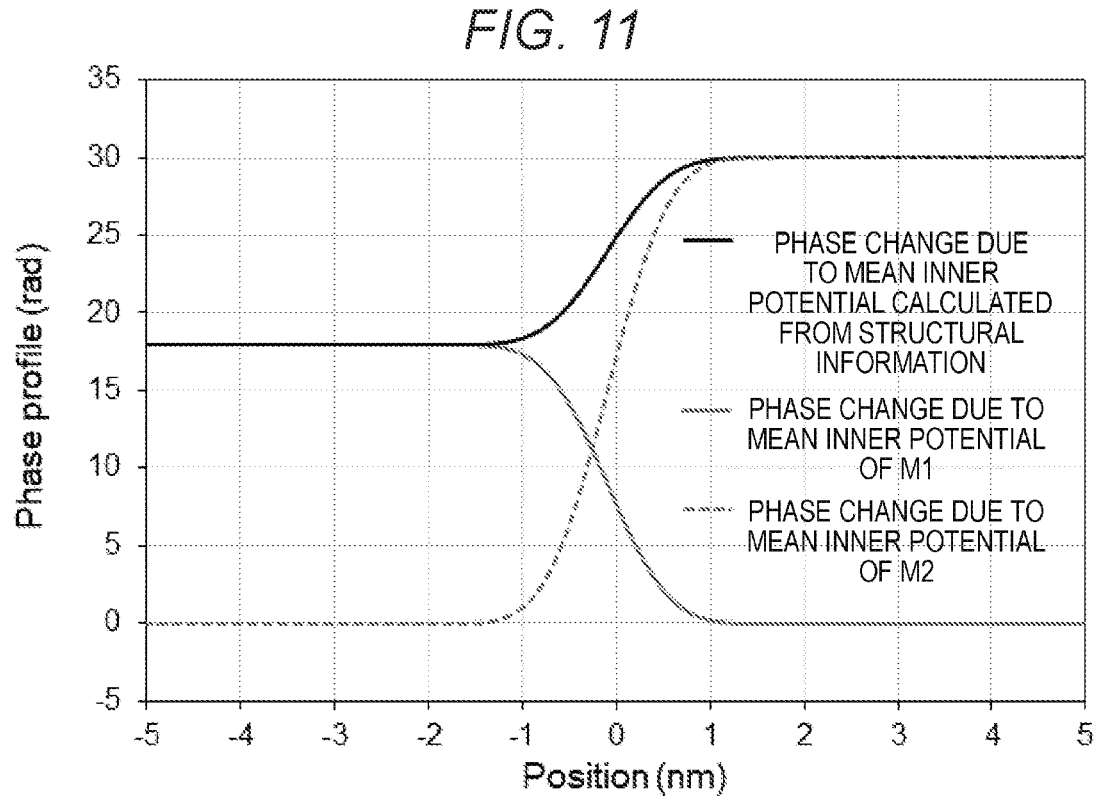
FIG. 11 is a schematic diagram illustrating a structural phase calculated from structural information.

By using FIG. 10 illustrating the relationship between the Z signal and the phase change, a structure-derived phase change (FIG. 11) can be obtained from the Z signal. There is a method of calculating the relationship between the Z signal and the phase change using a theoretical simulation, but considering that the relationship changes slightly depending on the experimental conditions, a method of experimentally obtaining the relationship using a standard sample is considered useful.

Figure 12:
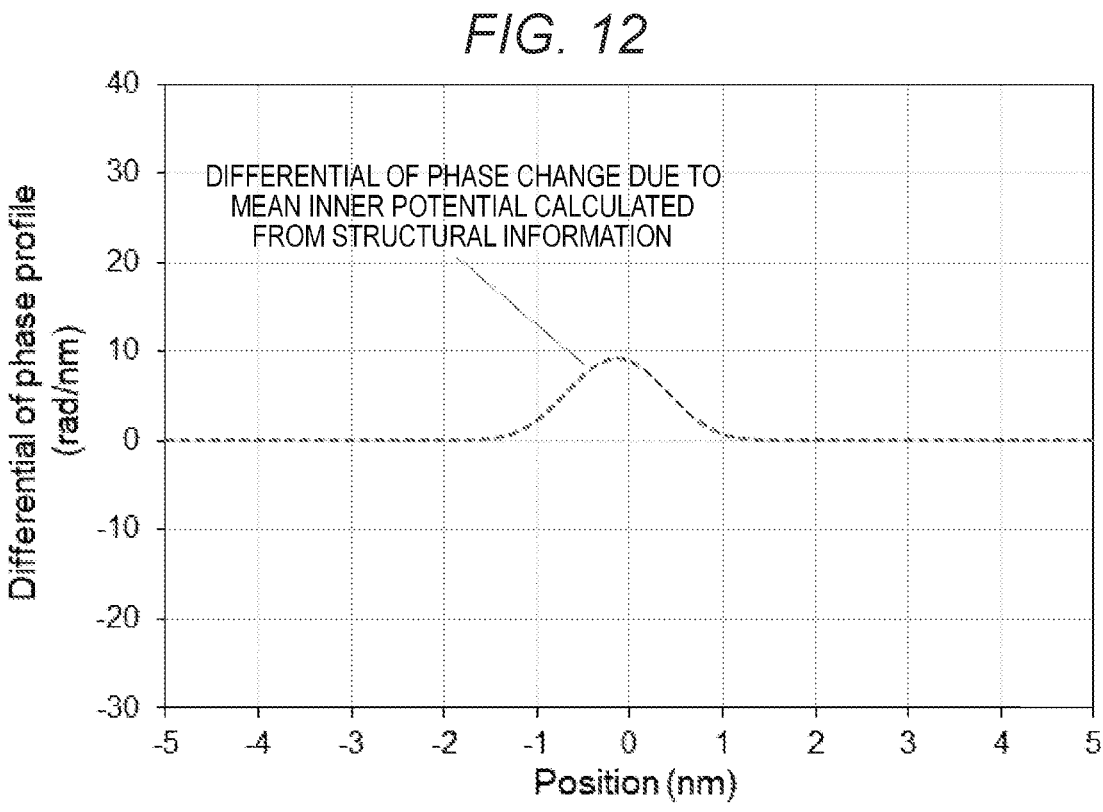
FIG. 12 is a schematic diagram illustrating a differential of the structural phase calculated from the structural information.

FIG. 12 illustrates the result obtained by differentiating the structure-derived phase change obtained by stepwise computation based on the ADF intensity.

Figure 13:
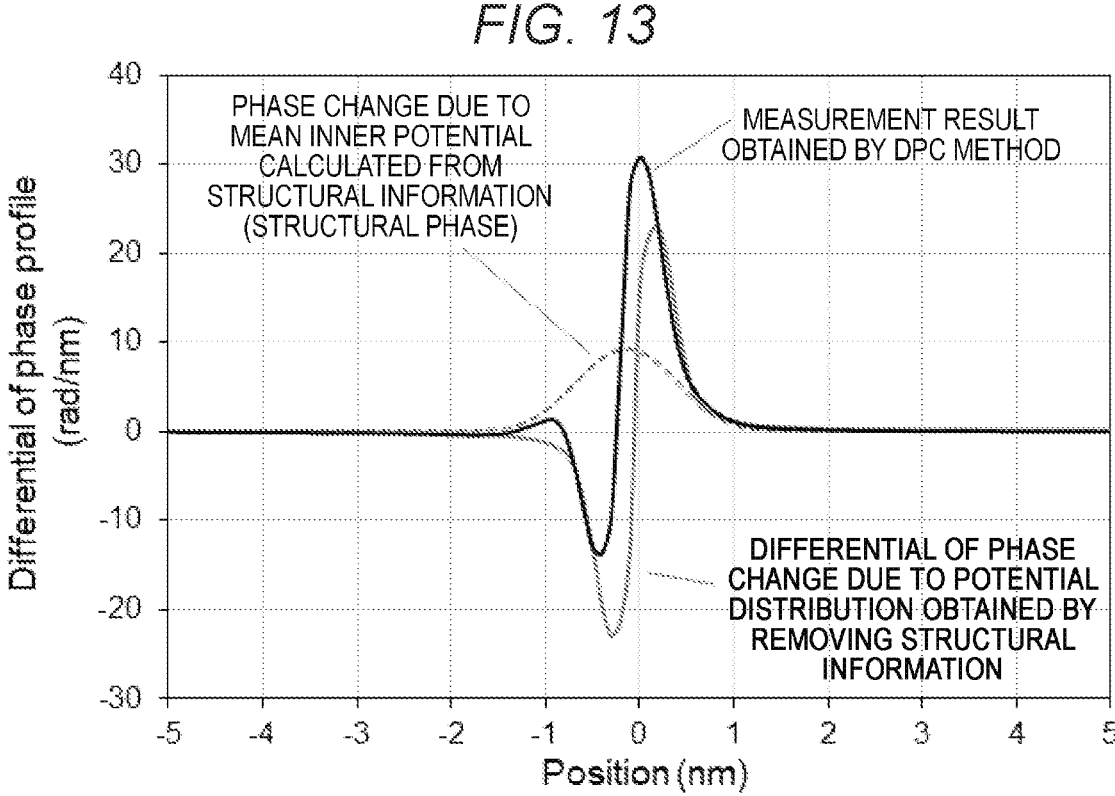
FIG. 13 is a schematic diagram illustrating a differential of the phase change due to potential distribution obtained by removing the structural phase calculated from structural the information from a differential phase obtained by a DPC method.

Finally, as illustrated in FIG. 13, by subtracting the differential value of the structure-derived phase change, which is calculated from the structural information, from the measurement t results (differential of total phase) obtained by the DPC method, it is possible to obtain the differential value of the phase change due to the potential distribution intended to be originally measured. When the differential value is obtained, the phase distribution can be obtained by integrating the value.

Although one-dimensional profile has been described so far, a two-dimensional image of the differential value of the phase change due to the potential distribution can be obtained by performing the same analysis in the x- and y-directions.

Such analysis can be performed in the same way even when the measurement target matches the magnetic field distribution, and the differential value of the magnetic field-derived phase change can be obtained by removing the differential value of the sample structure-derived phase change, which is obtained by performing a computation based on the ADF intensity, from the DPC measurement result. As with the potential, the distribution of the magnetic field phase can be obtained by integrating the phase differential value.

To describe the measurement system, swing-back of the electron beam will be described below with reference to FIG. 7.

The electron beam 2 is scanned using the scanning coil 32 to scan the electron beam on the sample surface. Here, it is necessary to adjust the position of the electron beam 2 in the camera 10 to not change when there is no differential phase difference (electron beam deflection) due to the sample 5. When the adjustment is not implemented, the position of the electron beam on the camera 10 changes due to the effect of the scanning coil 32, and a differential phase difference image of artifacts that are not information about the sample 5 is generated. Therefore, by interlocking the operation of a swing-back coil 33 with the scanning coil 32, a state in which the position of the electron beam at the position of the camera 10 does not change even when the electron beam 2 scans the sample surface using the scanning coil 32 is implemented.

Specifically, the scanning coil 32 is moved by a certain amount without the sample 5, and the current flowing through the swing-back coil 33 is calibrated so that the position of the electron beam 2 on the camera 10 does not change here. Accordingly, a ratio of a control current amount of the scanning coil 32 and the swing-back coil 33 for proper swing-back can be determined, and highly accurate measurement can be achieved by interlocking the scanning coil 32 and the swing-back coil 33 according to the control current ratio and scanning the electron beam.

In the electron microscope of FIG. 7, voltages to be applied to each of the electron source 1 and the acceleration tube 73, an excitation state of a sample fine movement mechanism 36 and an electron lens, control of the current flowing through the scanning coil 32 and the swing-back coil 33, and measurement of the electron beam by the camera 10 are controlled by the control system 38 connected to the control personal computer (PC) 34.

In an actual electron microscope, in addition to those illustrated in the schematic diagram, there are a deflection system for changing the traveling direction of the electron beam, a diaphragm mechanism for limiting the region through which the electron beam is transmitted, and the like, and such elements are also controlled by the control system 38 connected to the control PC 34. However, since such devices are not directly related to the electron microscope disclosed in the present specification, the devices are omitted in the figure.

The control PC 34 has a normal computer configuration including a central processing unit (CPU) as a processing unit, a memory as a storage unit, an input/output interface unit, and the like, which are interconnected. In the present specification, the control PC 34 and the control system 38, which control the device, may be collectively referred to as the control unit of the device. The control PC 34 is connected to the monitor 35.

As illustrated in the schematic diagram, electron optical elements are assembled in an electron microscope body 74, which is a vacuum container, and are continuously evacuated by a vacuum pump. Illustration and description of a vacuum system located outside the vicinity of a sample chamber are also omitted because the vacuum system is not directly related to the electron microscope of the present invention.

Figures 14, 15:
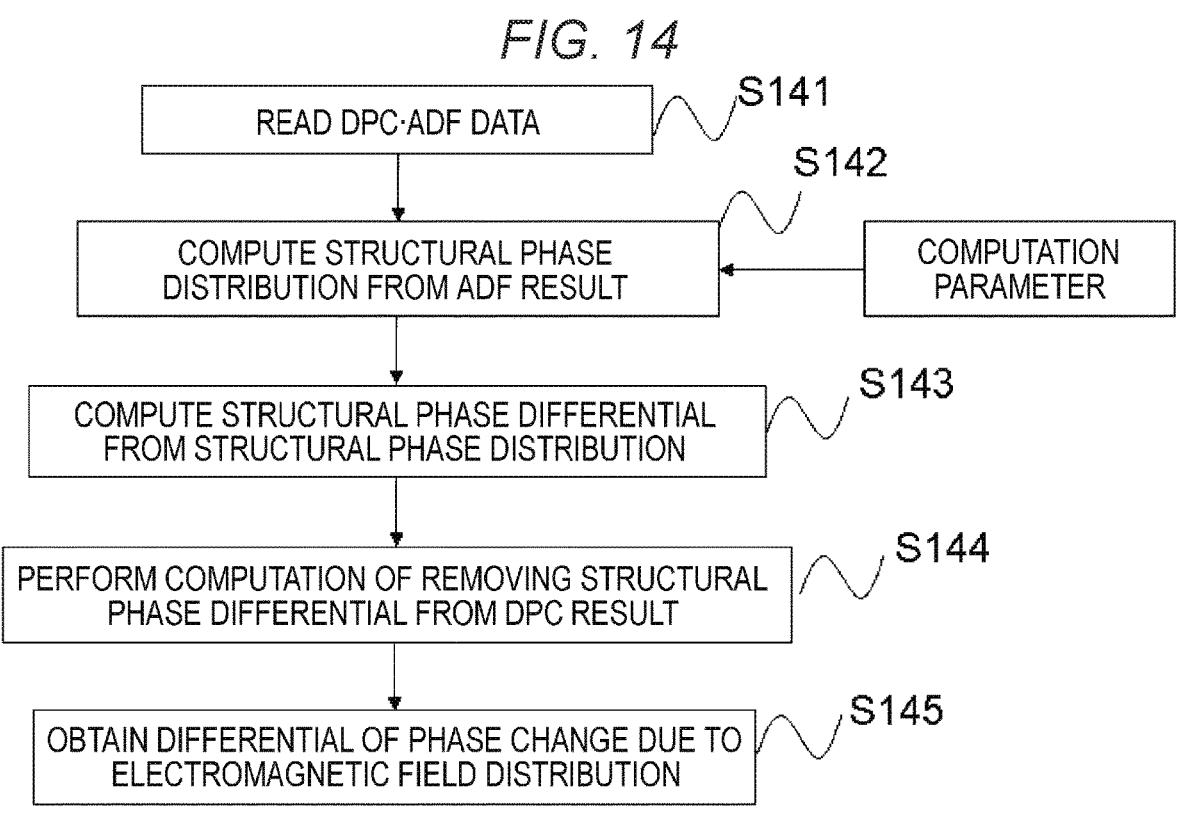
FIG. 14 is a schematic diagram illustrating a flow of data analysis.
FIG. 15 is a schematic diagram illustrating an example of a GUI for data analysis.

FIG. 14 illustrates a flow of data analysis.

First, DPC data and ADE data are read (step 141). Here, each data may be data obtained at the same time, or may be data obtained with another device at another timing.

Next, computation parameters (relationship between ADF intensity and structural phase) are read, and a structural phase distribution is computed from the ADF intensity (step 142). Next, a structural phase differential is computed from the structural phase distribution (step 143).

Next, a computation of removing the structural phase differential from the DPC result is performed (step 144). Accordingly, the differential of phase change due to an electromagnetic field distribution is obtained (step 145). A phase image is obtained by integrating the differential value of the phase.

FIG. 15 illustrates an example of a schematic diagram of a GUI for data analysis.

The GUI includes buttons for selecting DPC data and structural data (ADF intensity data), a button for selecting structural phase computation parameters, a computation execution button for computing the structural phase differential, a button for executing a process of removing the structural phase differential from the DPC data, buttons for displaying or saving the differential of the phase change due to the structure distribution, and buttons for displaying or saving the differential of the phase change due to the electromagnetic field distribution.

Regarding the save button, a function to set a save destination and a save file name is generally provided, and thus the description thereof is omitted here.

According to the aspect of the phase analysis system and the electron microscope of Example 1, it is possible to accurately obtain the potential-derived phase change and the magnetic field-derived phase change intended to be measured in a measurement target whose structure-derived phase (structural phase) changes due to a change in the sample structure.

The problem that the phase due to the electromagnetic field cannot be accurately measured due to the structure-derived phase change is also a problem in the measurement methods using electron holography, synchrotron radiation, and neutron beams. By using the present invention, the structure-derived phase change can be removed from structural information obtained simultaneously or with a separate device. Since such combination is an application method that can be easily inferred, an additional detailed description thereof is omitted.

Thus, for example, the potential distribution in a semiconductor device composed of a plurality of substances can be measured with high accuracy. In high-resolution observation, structural information and electromagnetic field information can be separated by simulating or experimentally obtaining the relationship between the ADF intensity and a phase change amount. Thus, the present invention is expected to be applied for development to the direct observation of the potential distribution derived from the bonding between atoms with atomic-level resolution and the magnetic moment with atomic resolution.

Such atomic-level electromagnetic field measurements have recently attracted a great deal of attention, and it is expected to contribute to the innovation of materials such as various energy conversion materials, fuel cells, Li-ion batteries, and artificial photosynthesis catalysts toward the realization of carbon neutrality and to the elucidation of deterioration mechanism toward the optimization of control thereof.

Example 2

Figure 16A:
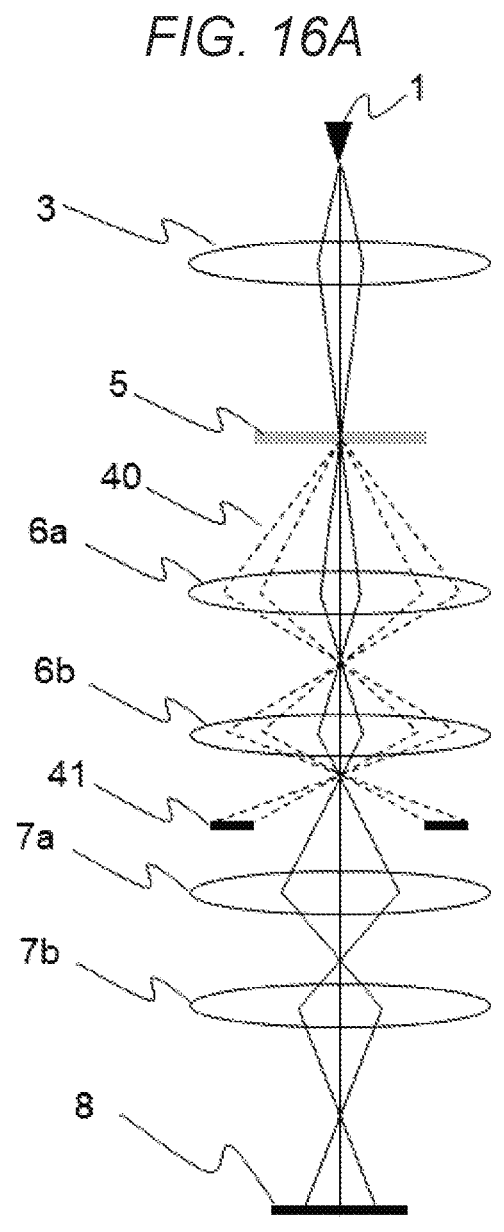
Figure 16B:
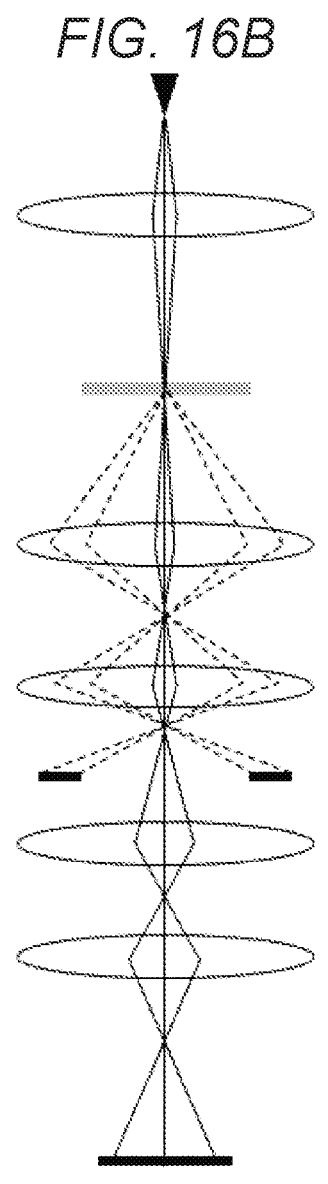
Figure 16C:
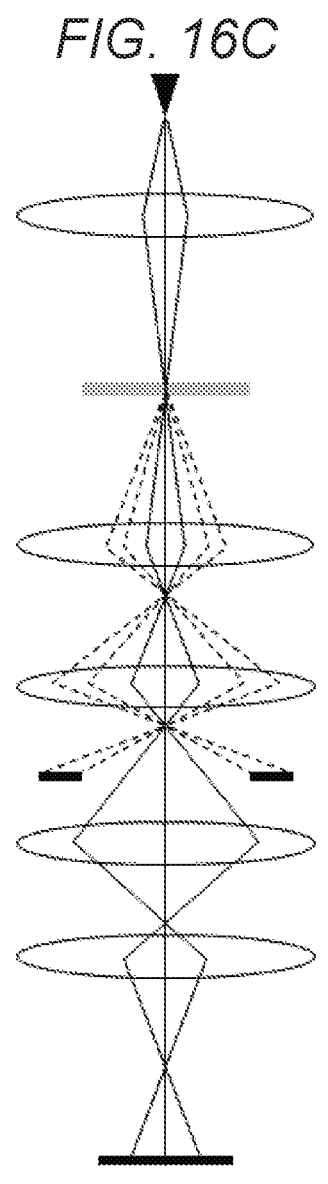

FIGS. 16A to 16C are schematic diagrams of a system in which the phase analysis system of Example 2 and an electron microscope capable of changing measurement conditions are combined. Since the configuration of the present example is similar to that of Example 1, the description of the same parts as those of Example 1 will be omitted, and the points of difference in the device configuration will be described.

The system includes a first ADF projection lens 6a and a second ADF projection lens 6b between the sample 5 and the annular detector 41, and includes a first magnifying lens 7a and a second magnifying lens 7b provided between the annular detector 41 and the observation surface 8.

By adjusting effects of the first magnifying lens 7a and the second magnifying lens 7b, it is possible to increase the camera length projected onto the camera 10 while maintaining an angle range of the electrons scattered by the sample 5 detected by the annular detector 41 under the measurement conditions of FIG. 16A, such that an angle of an irradiated electron beam is reduced, and phase sensitivity to the electromagnetic field is improved (see FIG. 16B).

By adjusting the effects of the ADF projection lens 6a, the second ADF projection lens 6b, the first magnifying lens 7a, and the second magnifying lens 7b, it is possible to change the angular range of the electrons scattered by the sample detected by the annular detector 41 while maintaining the camera length projected onto the camera 10 (see FIG. 16C).

By combining such functions, it is possible to freely adjust the angular range of the electrons scattered by the sample 5 detected by the annular detector 41 and the camera length projected onto the camera 10, and optimize the measurement conditions according to the measurement target.

The essence of Example 2 is to combine the phase analysis system with the electron microscope whose measurement conditions can be changed, and is not limited to the configuration illustrated in FIG. 7, such as the number of ADF projection lenses and magnifying lenses.

Example 3

Figure 17:
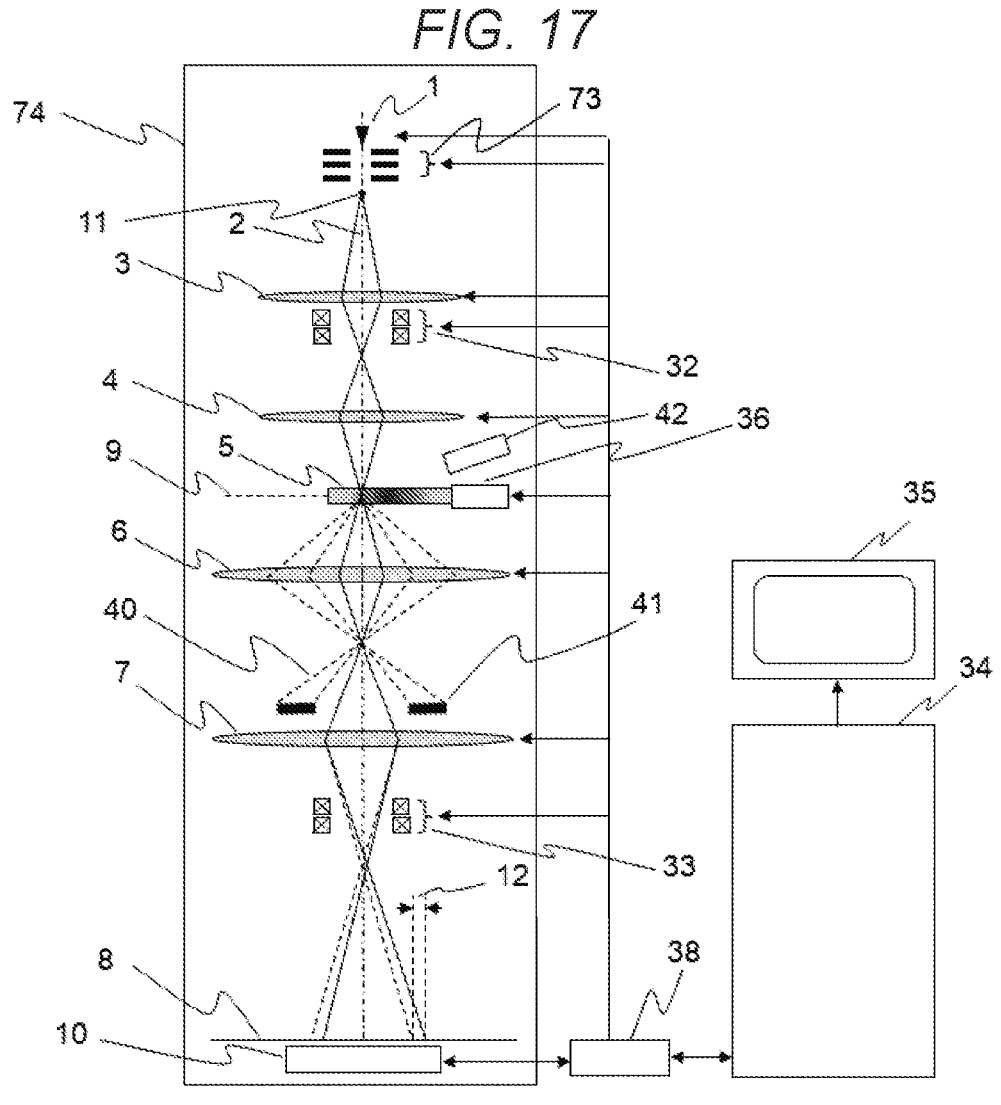
FIG. 17 is a schematic diagram illustrating a phase analysis system combined with an electron microscope including an energy dispersive X-ray spectroscope (EDX) according to Example 3.

FIG. 17 is a schematic diagram illustrating a phase analysis system combined with an electron microscope including an energy dispersive X-ray spectrometer (EDX) of Example 3.

Example 3 is a phase analysis system that makes use of the characteristics that the electron beam 2 is converged and irradiated onto the sample 5 and is combined with various measurements and element analyses. The phase analysis system is provided with an energy dispersive X-ray spectrometer 42, which enables element analysis of the sample 5.

By obtaining the relationship between the EDX intensity and the phase change separately by simulation or experimentally, the structure-derived phase change of the electron beam can be computed from the structural information by EDX data. Since other processing is similar to those of Example 1, the description thereof is omitted here.

Figure 18:
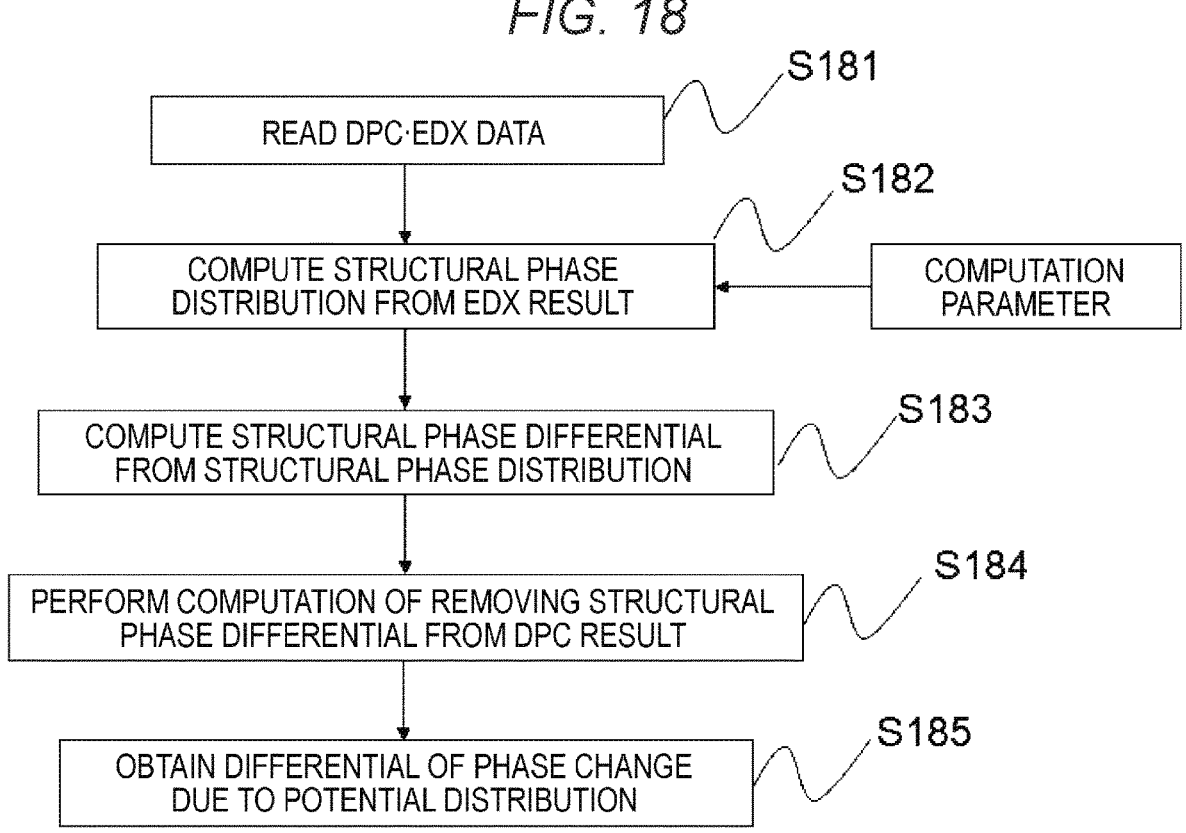
FIG. 18 is a schematic diagram illustrating a flow of data analysis using EDX data as structural information.

FIG. 18 illustrates a schematic diagram illustrating the flow of data analysis using the EDX data as structural information. The essence is a portion where the ADF intensity in Example 1 is replaced with an EDX result.

First, DPC data and EDX data are read (step 181). Here, each data may be data obtained at the same time, or may be data obtained with another device at another timing.

Next, computation parameters (relationship between EDX intensity and structural phase) are read, and structural phase distribution is computed from the EDX result (EDX intensity) (step 182). Next, a structural phase differential is computed from the structural phase distribution (step 183).

Next, a computation of removing the structural phase differential from the DPC result is performed (step 184). Accordingly, the differential of the phase change due to the electromagnetic field distribution is obtained (step 185). A phase image is obtained by integrating the differential value of the phase.

According to the aspect of the phase analysis system and the electron microscope of Example 3, in the measurement target whose structure-derived phase (structural phase) changes due to the change in the sample structure, the potential-derived phase change and the magnetic field-derived phase change intended to be measured can be obtained with high accuracy.

Other than the phase changes, measurement combined with optical characteristics using a cathode luminescence detector, which is not illustrated in FIG. 17, and the like are also be inferred. Simultaneous acquisition of the various analysis results and phase differential images is very useful for understanding the sample in more detail.

The essence of the present example is that the example is a phase analysis system combined with an electron microscope including the energy dispersive X-ray spectrometer (EDX) 42, and is not limited to the configuration illustrated in FIG. 17. It is also possible to perform measurement by combining the energy dispersive X-ray spectrometer (EDX) 42 and the annular detector 41.

In the above example, a DPC image obtained by converging the electron beam on the sample, irradiating the sample with the electron beam to scan the sample, and detecting the differential phase of the electron beam changed by the electromagnetic field of the sample and structural information obtained at the same time, at another timing, with another device, or the like are used to compute the structural phase from the structural information and remove the influence of the structure from the DPC data. Thus, the analysis system has a function of obtaining the distribution information of the electromagnetic field intended to be measured.

According to the above example, it is possible to obtain the potential-derived phase change and the magnetic field-derived phase change intended to be measured in the mea-surement target in which the structure-derived phase (structural phase) changes due to a change in the sample structure.

The phase analysis system of the present invention described above has been put into practical use as a highly accurate electromagnetic field measurement system, and by implementing the present invention in a new system, it is possible to observe electromagnetic fields in devices having complex structures and electromagnetic fields at atomic level with higher sensitivity.

It is expected that the observation function newly implemented by the new system using the present invention will elucidate the mechanism of the catalyst and contribute to the development of high-performance, highly durable fuel cells and $CO_2$ fuel conversion catalysts that are required to realize a carbon-neutral society, which is required worldwide in the future.

What is claimed is:

1. An information processing system comprising:
an input unit that receives a structure distribution of a sample and a first phase distribution of an electron beam, X-ray, light or neutron beam transmitted through the sample;
a processing unit that computes a second phase distribution based on the structure distribution and computes an electromagnetic field component of the sample based on the first phase distribution and the second phase distribution; and
an output unit that outputs the electromagnetic field component.

2. The information processing system according to claim 1, wherein
the processing unit
computes a phase change due to a mean inner potential of the sample derived from the structure distribution as the second phase distribution, and
computes a third phase distribution, which is a phase change due to a potential distribution of the sample, as the electromagnetic field component.

3. The information processing system according to claim 2, wherein
the processing unit
computes the third phase distribution by subtracting the second phase distribution from the first phase distribution.

4. The information processing system according to claim 3, wherein
the processing unit
computes a first differential value of the first phase distribution and a second differential value of the second phase distribution,
computes a third differential value of the third phase distribution based on the first differential value and the second differential value, and
computes the electromagnetic field component of the sample based on the third differential value.

5. The information processing system according to claim 1, wherein
the structure distribution of the sample
includes distributions relating to composition, thickness or density of the sample.

6. A phase analysis system including an electron microscope and a control device for controlling the electron microscope, wherein
the electron microscope includes
an electron source that irradiates a sample with an electron beam, and an annular detector that detects scattered electrons scattered by the sample and outputs ADF data, and a detector that detects an electron beam transmitted through the sample and outputs DPC data, and the control device computes a structural phase distribution of the sample based on the ADF data, computes a structural phase differential value based on the structural phase distribution, and performs a computation of removing the structural phase differential value from the DPC data to compute a differential value of an electromagnetic field phase distribution.

7. The phase analysis system according to claim 6, wherein the control device generates a phase image or a differential phase difference image based on the differential value of the electromagnetic field phase distribution.

8. The phase analysis system according to claim 6, wherein detection conditions of the electron beam by the detector and the annular detector is made to be changeable.

9. The phase analysis system according to claim 6, wherein the structural phase distribution of the sample is obtained using a signal obtained by the annular detector.

10. The phase analysis system according to claim 6, wherein the structural phase distribution of the sample includes distributions relating to composition, thickness or density of the sample.

11. The phase analysis system according to claim 6, further comprising:

a display device including a display screen, wherein the display device displays, on the display screen, selection buttons for respectively executing selection of the DPC data and the ADF data, a computation r executing a computation of the structural phase differential value, a removal execution button for executing removal of the structural phase differential, and display buttons for respectively displaying the structural phase differential value and the differential value of the electromagnetic field phase distribution, and the control device computes the structural phase distribution, the structural phase differential value, and the differential value of the electromagnetic field phase distribution in response to an operation of the selection buttons, the computation execution button, the removal execution button, and the display buttons, respectively.

12. A phase analysis system including an electron microscope and a control device for controlling the electron microscope, wherein the electron microscope includes an electron source that irradiates a sample with an electron beam, an energy dispersive X-ray spectrometer that outputs EDX data, and a detector that detects an electron beam transmitted through the sample and outputs DPC data, and the control device computes a structural phase distribution of the sample based on the EDX data, computes a structural phase differential value based on the structural phase distribution, and performs a computation of removing the structural phase differential value from the DPC data to compute a differential value of a potential distribution.

13. The phase analysis system according to claim 12, wherein the control device generates a phase image or a differential phase difference image based on the differential value of the potential distribution.

14. The phase analysis system according to claim 12, wherein the structural phase distribution of the sample is obtained using a signal obtained by the energy dispersive X-ray spectrometer.

15. The phase analysis system according to claim 12, wherein the structural phase distribution of the sample includes distributions relating to composition, thickness or density of the sample.

* * * * *